(12) United States Patent
Terasaki

(10) Patent No.: US 11,396,059 B2
(45) Date of Patent: Jul. 26, 2022

(54) COPPER/CERAMIC BONDED BODY, INSULATING CIRCUIT SUBSTRATE, COPPER/CERAMIC BONDED BODY PRODUCTION METHOD, AND INSULATING CIRCUIT SUBSTRATE PRODUCTION METHOD

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 17/270,120

(22) PCT Filed: Aug. 27, 2019

(86) PCT No.: PCT/JP2019/033430
§ 371 (c)(1),
(2) Date: Feb. 22, 2021

(87) PCT Pub. No.: WO2020/045388
PCT Pub. Date: Mar. 5, 2020

(65) Prior Publication Data
US 2021/0178509 A1 Jun. 17, 2021

(30) Foreign Application Priority Data
Aug. 28, 2018 (JP) .............................. JP2018-159662

(51) Int. Cl.
*B23K 20/00* (2006.01)
*C04B 37/02* (2006.01)
(Continued)

(52) U.S. Cl.
CPC .............. *B23K 20/00* (2013.01); *C04B 37/02* (2013.01); *H01L 23/13* (2013.01); *H05K 1/0306* (2013.01); *H05K 1/09* (2013.01)

(58) Field of Classification Search
CPC ........ H05K 1/09; H05K 1/0306; H01L 23/13; C04B 37/02
(Continued)

(56) References Cited

U.S. PATENT DOCUMENTS

| 4,055,451 A | 10/1977 | Cockbain et al. |
| 2019/0135706 A1 | 5/2019 | Terasaki |

FOREIGN PATENT DOCUMENTS

| CN | 103717552 A | 4/2014 |
| CN | 105980334 A | 9/2016 |

(Continued)

OTHER PUBLICATIONS

Office Action dated Nov. 30, 2021, issued for Japanese Patent Application No. 2020-539468 and English translation thereof.
(Continued)

*Primary Examiner* — Tremesha S Willis
(74) *Attorney, Agent, or Firm* — Locke Lord LLP

(57) ABSTRACT

A copper/ceramic bonded body includes: a copper member made of copper or a copper alloy; and a ceramic member made of a silicon nitride, wherein the copper member and the ceramic member are bonded to each other, a magnesium oxide layer is provided on a ceramic member side of a bonded interface between the copper member and the ceramic member, a Mg solid solution layer is provided between the magnesium oxide layer and the copper member and contains Mg in a state of a solid solution in a Cu primary phase, and a magnesium nitride phase is present on a magnesium oxide layer side of the Mg solid solution layer.

8 Claims, 4 Drawing Sheets

(51) Int. Cl.
*H01L 23/13* (2006.01)
*H05K 1/03* (2006.01)
*H05K 1/09* (2006.01)

(58) Field of Classification Search
USPC ........................................................ 174/257
See application file for complete search history.

(56) References Cited

FOREIGN PATENT DOCUMENTS

| EP | 3590909 A1 | 1/2020 |
|---|---|---|
| JP | 62-288176 A | 12/1987 |
| JP | 64-072974 A | 3/1989 |
| JP | 04-162756 A | 6/1992 |
| JP | 2001-019567 A | 1/2001 |
| JP | 3211856 B2 | 9/2001 |
| JP | 2002-356376 A | 12/2002 |
| JP | 2004-231452 A | 8/2004 |
| JP | 2004-255416 A | 9/2004 |
| JP | 2005-240067 A | 9/2005 |
| JP | 4375730 B2 | 12/2009 |
| JP | 2018-506496 A | 3/2018 |
| WO | 2017/115461 A1 | 7/2017 |
| WO | 2018/003845 A1 | 1/2018 |

OTHER PUBLICATIONS

International Search Report dated Oct. 15, 2019, issued for PCT/JP2019/033430 and English translation thereof.
International Search Report dated Apr. 2, 2019, issued for PCT/JP2019/004013 and English translation thereof.
L. Mueller et al., "Magnesia and Yttria Based Coatings for Direct-Copper-Bonding of Silicon Nitride Ceramics", Advanced Ceramic Coatings and Interfaces IV, Nov. 9, 2009, pp. 21-32.
Notice of Allowance dated Mar. 8, 2022, issued for Japanese Patent Application No. 2020-539468 and English translation thereof.
Supplementary European Search Report dated Mar. 30, 2022, issued for European Patent Application No. 19853565.0.
Chinese Office Action Search Report dated Apr. 20, 2022 for CN Application No. 201980056160.9, 11 pages.

COPPER/CERAMIC BONDED BODY, INSULATING CIRCUIT SUBSTRATE, COPPER/CERAMIC BONDED BODY PRODUCTION METHOD, AND INSULATING CIRCUIT SUBSTRATE PRODUCTION METHOD

CROSS REFERENCE TO RELATED APPLICATIONS

This application is related to two co-pending applications: "COPPER/CERAMIC BONDED BODY, INSULATING CIRCUIT SUBSTRATE, COPPER/CERAMIC BONDED BODY PRODUCTION METHOD, AND INSULATING CIRCUIT SUBSTRATE PRODUCTION METHOD" filed even date herewith in the name of Nobuyuki TERASAKI as a national phase entry of PCT/JP2019/033427; and "COPPER/CERAMIC BONDED BODY, INSULATING CIRCUIT SUBSTRATE, COPPER/CERAMIC BONDED BODY PRODUCTION METHOD, AND INSULATING CIRCUIT SUBSTRATE PRODUCTION METHOD" filed even date herewith in the name of Nobuyuki TERASAKI as a national phase entry of PCT/JP2019/033461; which applications are assigned to the assignee of the present application and all three incorporated by reference herein.

TECHNICAL FIELD

This invention relates to a copper/ceramic bonded body in which a copper member made of copper or a copper alloy and a ceramic member made of a silicon nitride are bonded to each other, an insulating circuit substrate, a copper/ceramic bonded body production method, and an insulating circuit substrate production method.

Priority is claimed on Japanese Patent Application No. 2018-159662, filed Aug. 28, 2018, the content of which is incorporated herein by reference.

BACKGROUND ART

A power module, an LED module, and a thermoelectric module have a structure in which a power semiconductor element, an LED element, or a thermoelectric element is bonded to an insulating circuit substrate in which a circuit layer made of a conductive material is formed on one surface of an insulating layer.

For example, a power semiconductor element for large power control, which is used to control wind power generation, an electric vehicle, a hybrid vehicle, and the like, generates a large amount of heat during operation. Therefore, as a substrate having such a power semiconductor element mounted thereon, for example, an insulating circuit substrate provided with a ceramic substrate made of a silicon nitride or the like, and a circuit layer formed by bonding a metal sheet having excellent conductivity to one surface of the ceramic substrate has been widely used in the related art. As an insulating circuit substrate, one having a metal layer formed by bonding a metal sheet to the other surface of the ceramic substrate is also provided.

For example, Patent Document 1 proposes an insulating circuit substrate in which a first metal sheet and a second metal sheet respectively constituting a circuit layer and a metal layer are formed of a copper sheet, and the copper sheets are directly bonded to a ceramic substrate by a DBC method. In the DBC method, the copper sheets and the ceramic substrate are bonded by generating a liquid phase at the interfaces between the copper sheets and the ceramic substrate using a eutectic reaction of copper and copper oxides.

In addition, Patent Document 2 proposes an insulating circuit substrate in which a circuit layer and a metal layer are formed by bonding copper sheets to one surface and the other surface of a ceramic substrate. In the insulating circuit substrate, the copper sheets are disposed on one surface and the other surface of the ceramic substrate with a Ag—Cu—Ti-based brazing material interposed therebetween, and the copper sheets are bonded thereto by performing a heating treatment (so-called active metal brazing method). In the active metal brazing method, since the brazing material containing Ti as an active metal is used, the wettability between the molten brazing material and the ceramic substrate is improved, and the ceramic substrate and the copper sheets are reliably bonded to each other.

Furthermore, Patent Document 3 proposes, as a brazing material for bonding, which is used when a copper sheet and a ceramic substrate are bonded to each other in a high-temperature nitrogen gas atmosphere, a paste containing a powder made of a Cu—Mg—Ti alloy. In Patent Document 3, a configuration in which bonding is achieved by heating at 560° C. to 800° C. in a nitrogen gas atmosphere is provided, and Mg in the Cu—Mg—Ti alloy sublimates and does not remain at the bonded interface, while titanium nitride (TiN) is not substantially formed.

CITATION LIST

Patent Document

[Patent Document 1]
Japanese Unexamined Patent Application, First Publication No. H04-162756
[Patent Document 2]
Japanese Patent No. 3211856
[Patent Document 3]
Japanese Patent No. 4375730

SUMMARY OF INVENTION

Technical Problem

However, as disclosed in Patent Document 1, in a case where the ceramic substrate and the copper sheets are bonded according to the DBC method, the bonding temperature needs to be set to 1065° C. or higher (the eutectic point temperature of copper and copper oxides or higher), so that there is concern that the ceramic substrate may deteriorate during bonding. In addition, in a case where bonding is performed in a nitrogen gas atmosphere or the like, there is a problem in that atmospheric gas remains at the bonded interface and partial discharge is likely to occur.

As disclosed in Patent Document 2, in a case of bonding the ceramic substrate and the copper sheets according to the active metal brazing method, since the brazing material contains Ag and Ag is present at the bonded interface, migration easily occurs, and use for high-voltage applications cannot be achieved. In addition, since the bonding temperature is relatively as high as 900° C., there is concern that the ceramic substrate may deteriorate. Furthermore, an intermetallic compound phase containing a titanium nitride phase and Ti is generated in the vicinity of the bonding surface of the ceramic substrate, and there is concern that breaking may occur in the ceramic substrate during high-temperature operation.

As disclosed in Patent Document 3, in a case where bonding is performed in a nitrogen gas atmosphere using a brazing material for bonding, which is formed of the paste containing a powder made of a Cu—Mg—Ti alloy, gas remains at the bonded interface, and there is a problem in that partial discharge easily occurs. In addition, there is concern that organic matter contained in the paste remains at the bonded interface and may result in insufficient bonding. Furthermore, an intermetallic compound phase containing Ti is generated in the vicinity of the bonding surface of the ceramic substrate, and there is concern that breaking may occur in the ceramic substrate during high-temperature operation.

The present invention has been made in view of the above-described circumstances, and an objective thereof is to provide a copper/ceramic bonded body in which a copper member and a ceramic member are reliably bonded to each other, excellent migration resistance is achieved, and the occurrence of ceramic breaking during high-temperature operation can be suppressed, an insulating circuit substrate, a production method of the copper/ceramic bonded body, and a production method of the insulating circuit substrate.

Solution to Problem

In order to solve these problems and achieve the above-mentioned object, a copper/ceramic bonded body of the present invention is a copper/ceramic bonded body, including: a copper member made of copper or a copper alloy; and a ceramic member made of a silicon nitride, wherein, the copper member and the ceramic member are bonded to each other, a magnesium oxide layer is provided on a ceramic member side of a bonded interface between the copper member and the ceramic member, a Mg solid solution layer is provided between the magnesium oxide layer and the copper member and contains Mg in a state of a solid solution in a Cu primary phase, and a magnesium nitride phase is present on a magnesium oxide layer side of the Mg solid solution layer.

In the copper/ceramic bonded body having the configuration, the magnesium oxide layer is formed on the ceramic member side of the bonded interface between the copper member and the ceramic member, the Mg solid solution layer is formed between the magnesium oxide layer and the copper member, and the magnesium nitride phase is present on the magnesium oxide layer side of the Mg solid solution layer. The magnesium nitride phase is formed by the reaction between Mg disposed between the ceramic member and the copper member and nitrogen in the ceramic member, and thus the ceramic member sufficiently reacts.

Therefore, the copper/ceramic bonded body in which the interfacial reaction sufficiently proceeds at the bonded interface between the copper member and the ceramic member and the copper member and the ceramic member are reliably bonded to each other can be obtained.

Since Ti, Zr, Nb, and Hf are not present at the bonded interface between the Cu member and the ceramic member, a nitride phase of Ti, Zr, Nb, and Hf and an intermetallic compound phase containing Ti, Zr, Nb, and Hf are not generated, and breaking of the ceramic member can be suppressed even during high-temperature operation.

Since Ag is not present at the bonded interface between the Cu member and the ceramic member, excellent migration resistance is also achieved.

In the copper/ceramic bonded body of the present invention, it is preferable that in a region from a bonding surface of the ceramic member to 50 μm toward a copper member side, an area ratio of an intermetallic compound phase be 15% or less.

In this case, since the area ratio of the intermetallic compound phase in the region from the bonding surface of the ceramic member to 50 μm toward the copper member side is 15% or less, there are not a large number of hard and brittle intermetallic compound phases in the vicinity of the bonding surface of the ceramic member, and it becomes possible to reliably suppress breaking of the ceramic member during high-temperature operation.

In the present invention, a nitride phase and an oxide phase are excluded from the above-mentioned intermetallic compound phase.

An insulating circuit substrate of the present invention is an insulating circuit substrate, including: a copper sheet made of copper or a copper alloy; and a ceramic substrate made of a silicon nitride, wherein, the copper sheet is bonded to a surface of the ceramic substrate, a magnesium oxide layer is provided on a ceramic substrate side of a bonded interface between the copper sheet and the ceramic substrate, a Mg solid solution layer is provided between the magnesium oxide layer and the copper sheet and contains Mg in a state of a solid solution in a Cu primary phase, and a magnesium nitride phase is present on a magnesium oxide layer side of the Mg solid solution layer.

In the insulating circuit substrate having the configuration, the copper sheet and the ceramic substrate are reliably bonded to each other, and excellent migration resistance is achieved, so that the insulating circuit substrate can be used with high reliability even under high-voltage conditions.

It is possible to suppress the occurrence of breaking in the ceramic substrate during high-temperature operation, and the insulating circuit substrate can be used with high reliability even under high-temperature conditions.

In the insulating circuit substrate of the present invention, it is preferable that in a region from a bonding surface of the ceramic substrate to 50 μm toward a copper sheet side, an area ratio of an intermetallic compound phase be 15% or less.

In this case, since the area ratio of the intermetallic compound phase in the region from the bonding surface of the ceramic substrate to 50 μm toward the copper sheet side is 15% or less, there are not a large number of hard and brittle intermetallic compound phases in the vicinity of the bonding surface of the ceramic substrate, and it becomes possible to reliably suppress breaking of the ceramic substrate during high-temperature operation.

In the present invention, a nitride phase and an oxide phase are excluded from the above-mentioned intermetallic compound phase.

A production method of a copper/ceramic bonded body of the present invention is a production method of a copper/ceramic bonded body for producing the above-described copper/ceramic bonded body, the production method including: a Mg-disposing step of disposing Mg between the copper member and the ceramic member; a laminating step of laminating the copper member and the ceramic member with Mg interposed therebetween; and a bonding step of performing a heating treatment on the copper member and the ceramic member laminated with Mg interposed therebetween in a state of being pressed in a laminating direction under a vacuum atmosphere to bond the copper member and the ceramic member to each other, in which, in the Mg-disposing step, an amount of Mg is in a range of 0.17 mg/cm$^2$ or more and 3.48 mg/cm$^2$ or less.

According to the production method of a copper/ceramic bonded body having the above configuration, since Mg is disposed between the copper member and the ceramic member and is subjected to the heating treatment in a state of being pressed in the laminating direction under the vacuum atmosphere, no gas or no residue of organic matter remains at the bonded interface.

In the Mg-disposing step, since the amount of Mg is in a range of 0.17 mg/cm$^2$ or more and 3.48 mg/cm$^2$ or less, a liquid phase necessary for the interfacial reaction can be sufficiently obtained. Therefore, it becomes possible to obtain the copper/ceramic bonded body in which the copper member and the ceramic member are reliably bonded to each other.

Since Ti, Zr, Nb, and Hf are not used for bonding, a nitride phase of Ti, Zr, Nb, and Hf and an intermetallic compound phase containing Ti, Zr, Nb, and Hf are not present in the vicinity of the bonding surface of the ceramic member, and the copper/ceramic bonded body capable of suppressing breaking of the ceramic member during high-temperature operation can be obtained.

Since Ag is not used for bonding, the copper/ceramic bonded body excellent in migration resistance can be obtained.

In the production method of a copper/ceramic bonded body of the present invention, it is preferable that, in the bonding step, a pressing load be in a range of 0.049 MPa or more and 3.4 MPa or less, and a heating temperature be in a range of 500° C. or higher and 850° C. or lower.

In this case, since the pressing load in the bonding step is in a range of 0.049 MPa or more and 3.4 MPa or less, the ceramic member, the copper member, and Mg can be brought into close contact, so that the interfacial reactions therebetween during heating can be promoted.

Since the heating temperature in the bonding step is equal to or higher than 500° C., which is higher than the eutectic temperature of Cu and Mg, a liquid phase can be sufficiently generated at the bonded interface. On the other hand, since the heating temperature in the bonding step is 850° C. or lower, the excessive generation of the liquid phase can be suppressed. Furthermore, the thermal load on the ceramic member is reduced, so that the deterioration of the ceramic member can be suppressed. A production method of an insulating circuit substrate of the present invention is a production method of an insulating circuit substrate for producing the above-described insulating circuit substrate, the production method including: a Mg-disposing step of disposing Mg between the copper sheet and the ceramic substrate; a laminating step of laminating the copper sheet and the ceramic substrate with Mg interposed therebetween; and a bonding step of performing a heating treatment on the copper sheet and the ceramic substrate laminated with Mg interposed therebetween in a state of being pressed in a laminating direction under a vacuum atmosphere to bond the copper sheet and the ceramic substrate to each other, in which, in the Mg-disposing step, an amount of Mg is in a range of 0.17 mg/cm$^2$ or more and 3.48 mg/cm$^2$ or less.

According to the production method of the insulating circuit substrate having the above configuration, since Mg is disposed between the copper sheet and the ceramic substrate and is subjected to the heating treatment in a state of being pressed in the laminating direction under the vacuum atmosphere, no gas or no residue of organic matter remains at the bonded interface.

In the Mg-disposing step, since the amount of Mg is in a range of 0.17 mg/cm$^2$ or more and 3.48 mg/cm$^2$ or less, a liquid phase necessary for the interfacial reaction can be sufficiently obtained. Therefore, it becomes possible to obtain the insulating circuit substrate in which the copper sheet and the ceramic substrate are reliably bonded to each other. In addition, since Ti, Zr, Nb, and Hf are not used for bonding, a nitride phase of Ti, Zr, Nb, and Hf and an intermetallic compound phase containing Ti, Zr, Nb, and Hf are not present in the vicinity of the bonding surface of the ceramic substrate, and the insulating circuit substrate capable of suppressing breaking of the ceramic substrate during high-temperature operation can be obtained.

Since Ag is not used for bonding, the insulating circuit substrate excellent in migration resistance can be obtained.

In the production method of the insulating circuit substrate of the present invention, it is preferable that, in the bonding step, a pressing load be in a range of 0.049 MPa or more and 3.4 MPa or less, and a heating temperature be in a range of 500° C. or higher and 850° C. or lower.

In this case, since the pressing load in the bonding step is in a range of 0.049 MPa or more and 3.4 MPa or less, the ceramic substrate, the copper sheet, and Mg can be brought into close contact, so that the interfacial reactions therebetween during heating can be promoted.

Since the heating temperature in the bonding step is equal to or higher than 500° C., which is higher than the eutectic temperature of Cu and Mg, a liquid phase can be sufficiently generated at the bonded interface. On the other hand, since the heating temperature in the bonding step is 850° C. or lower, the excessive generation of the liquid phase can be suppressed. Furthermore, the thermal load on the ceramic substrate is reduced, so that the deterioration of the ceramic substrate can be suppressed.

Advantageous Effects of Invention

According to the present invention, it becomes possible to provide a copper/ceramic bonded body in which a copper member and a ceramic member are reliably bonded to each other, excellent migration resistance is achieved, and the occurrence of ceramic breaking during high-temperature operation can be suppressed, an insulating circuit substrate, a production method of the copper/ceramic bonded body, and a production method of the insulating circuit substrate.

DESCRIPTION OF EMBODIMENTS

Figure 1:
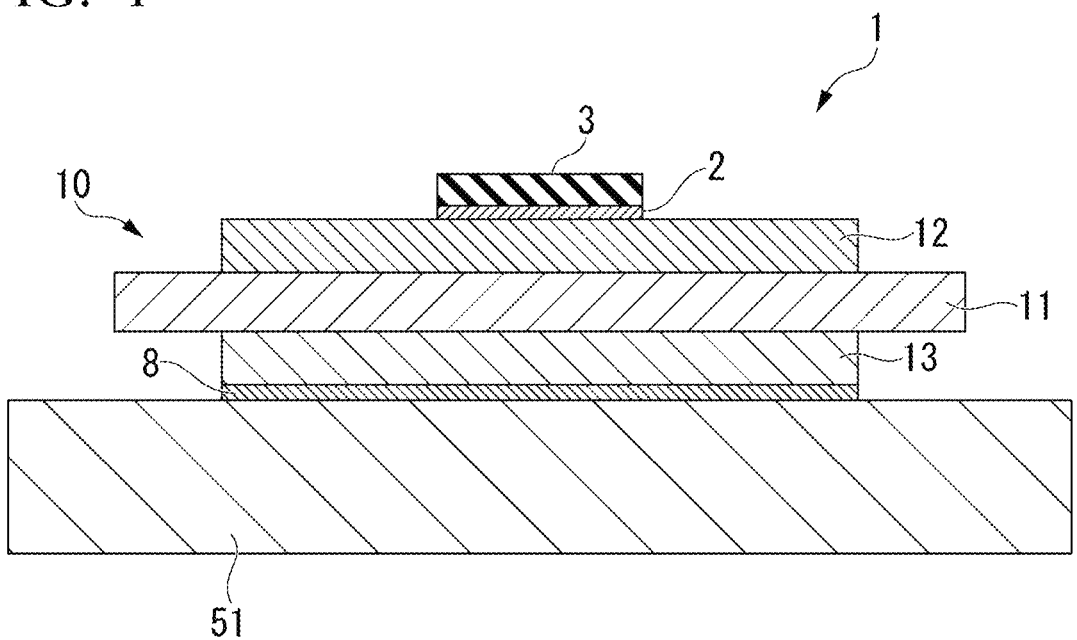
FIG. 1 is a schematic explanatory view of a power module using an insulating circuit substrate (copper/ceramic bonded body) according to an embodiment of the present invention.

Hereinafter, embodiments of the present invention will be described with reference to the accompanying drawings.

A copper/ceramic bonded body according to the present embodiment is an insulating circuit substrate 10 configured by bonding a ceramic substrate 11 which is a ceramic member to a copper sheet 22 (circuit layer 12) and to a copper sheet 23 (metal layer 13), which are copper members.

FIG. 1 illustrates the insulating circuit substrate 10 according to the embodiment of the present invention and a power module 1 using the insulating circuit substrate 10.

The power module 1 includes the insulating circuit substrate 10, a semiconductor element 3 bonded to one side (upper side in FIG. 1) of the insulating circuit substrate 10 with a first solder layer 2 interposed therebetween, and a heat sink 51 bonded to the other side (lower side in FIG. 1) of the insulating circuit substrate 10 with a second solder layer 8 interposed therebetween.

The insulating circuit substrate 10 includes the ceramic substrate 11, the circuit layer 12 disposed on one surface (upper surface in FIG. 1) of the ceramic substrate 11, and the metal layer 13 disposed on the other surface (lower surface in FIG. 1) of the ceramic substrate 11.

The ceramic substrate 11 prevents the electrical connection between the circuit layer 12 and the metal layer 13, and is made of a silicon nitride having high insulating properties, in the present embodiment. The thickness of the ceramic substrate 11 is set to be in a range of 0.2 mm or more and 1.5 mm or less, and in the present embodiment, the thickness of the ceramic substrate 11 is preferably 0.32 mm.

Figure 4:
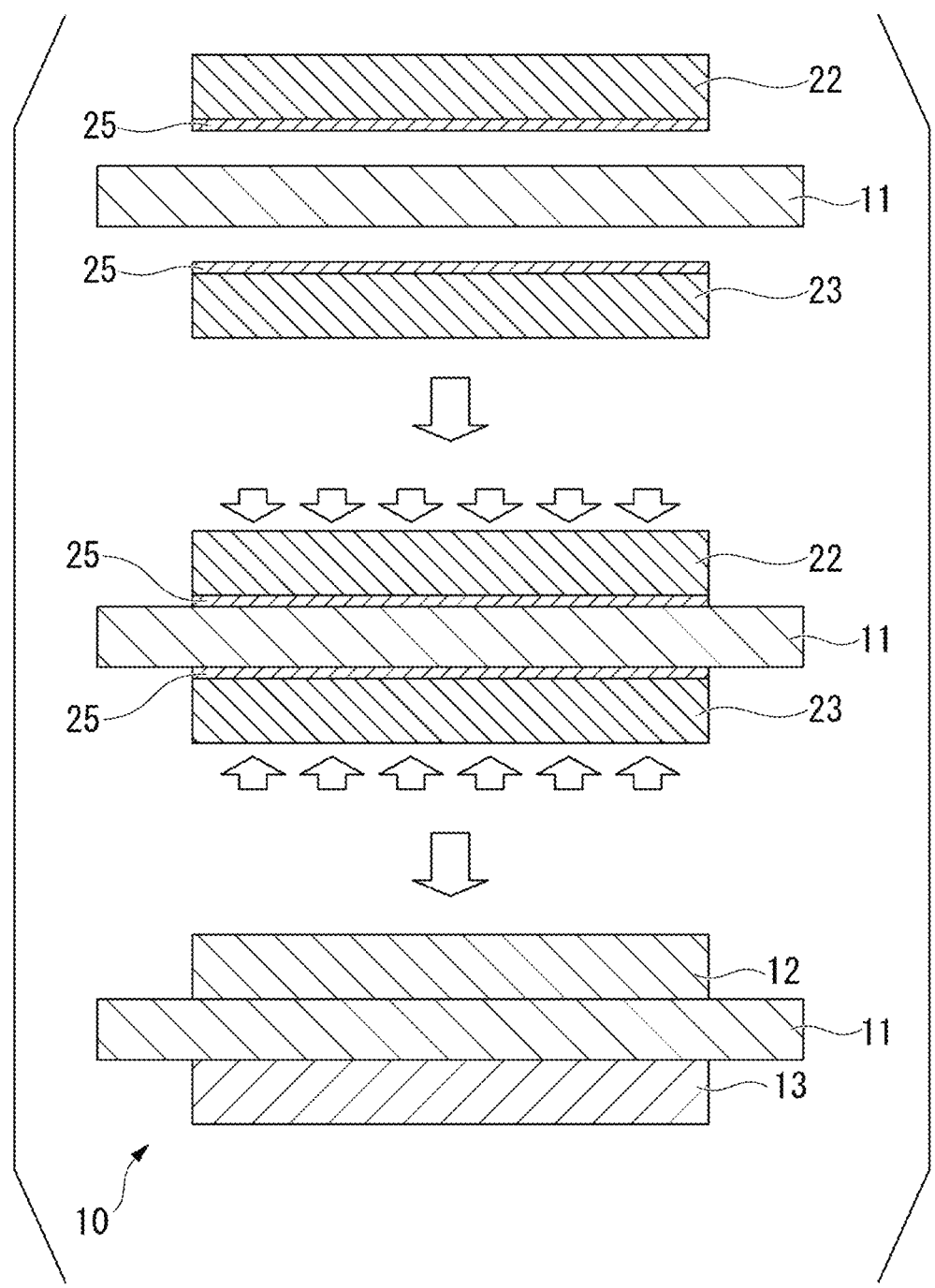
FIG. 4 is an explanatory view showing the production method of the insulating circuit substrate (copper/ceramic bonded body) according to the embodiment of the present invention.

As illustrated in FIG. 4, the circuit layer 12 is formed by bonding the copper sheet 22 made of copper or a copper alloy to one surface of the ceramic substrate 11. In the present embodiment, a rolled sheet of oxygen-free copper is used as the copper sheet 22 constituting the circuit layer 12. A circuit pattern is formed on the circuit layer 12, and one surface thereof (upper surface in FIG. 1) becomes a mounting surface on which the semiconductor element 3 is mounted. The thickness of the circuit layer 12 is set to be in a range of 0.1 mm or more and 1.0 mm or less, and in the present embodiment, the thickness of the circuit layer 12 is preferably 0.6 mm.

As illustrated in FIG. 4, the metal layer 13 is formed by bonding the copper sheet 23 made of copper or a copper alloy to the other surface of the ceramic substrate 11. In the present embodiment, a rolled sheet of oxygen-free copper is used as the copper sheet 23 constituting the metal layer 13. The thickness of the metal layer 13 is set to be in a range of 0.1 mm or more and 1.0 mm or less, and in the present embodiment, the thickness of the metal layer 13 is preferably 0.6 mm.

The heat sink 51 is for cooling the above-mentioned insulating circuit substrate 10, and in the present embodiment, is a heat-dissipating sheet made of a material having good thermal conductivity. In the present embodiment, the heat sink 51 is made of copper or a copper alloy excellent in thermal conductivity. The heat sink 51 and the metal layer 13 of the insulating circuit substrate 10 are bonded to each other with the second solder layer 8 interposed therebetween.

The ceramic substrate 11 and the circuit layer 12 (copper sheet 22), and the ceramic substrate 11 and the metal layer 13 (copper sheet 23) are bonded to each other with a Mg film 25 interposed therebetween as illustrated in FIG. 4.

Figure 2:
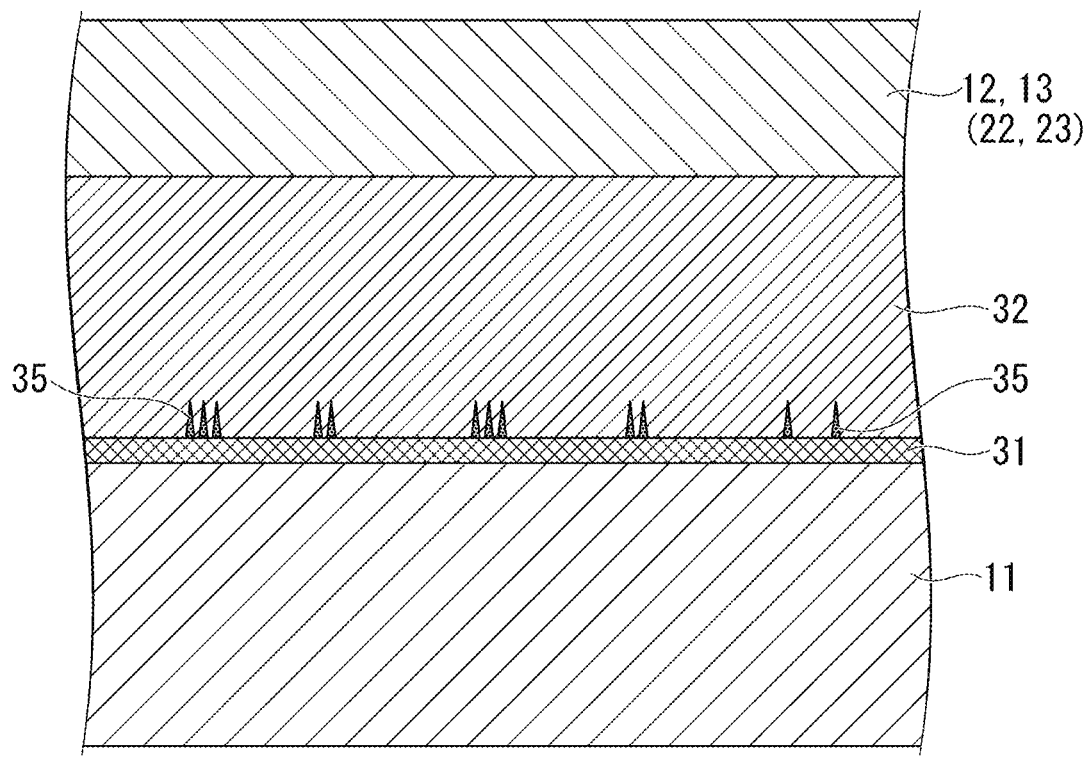
FIG. 2 is a schematic view of a bonded interface between a circuit layer (copper member) and a metal layer (copper member) and a ceramic substrate (ceramic member) of an insulating circuit substrate (copper/ceramic bonded body) according to the embodiment of the present invention.

At the bonded interface between the ceramic substrate 11 and the circuit layer 12 (copper sheet 22) and the bonded interface between the ceramic substrate 11 and the metal layer 13 (copper sheet 23), as illustrated in FIG. 2, a structure in which a magnesium oxide layer 31 formed on the ceramic substrate 11 side of the bonded interface and a Mg solid solution layer 32 in which Mg is in a state of a solid solution in a Cu primary phase are laminated is provided.

The magnesium oxide layer 31 is made of, for example, MgO. The thickness of the magnesium oxide layer 31 is in a range of 2 nm or more and 30 nm or less, and preferably in a range of 5 nm or more and 15 nm or less. It is presumed that the magnesium oxide layer 31 is formed by the reaction of oxygen (O) of the oxide formed on the surface of the ceramic substrate 11 and magnesium (Mg) of the Mg film 25.

The amount of Mg in the Mg solid solution layer 32 is in a range of 0.01 at % or more and 3 at % or less. The thickness of the Mg solid solution layer 32 is in a range of 0.1 μm or more and 150 μm or less, and preferably in a range of 0.1 μm or more and 80 μm or less.

A magnesium nitride phase 35 is formed on the magnesium oxide layer 31 side of the Mg solid solution layer 32. The magnesium nitride phase 35 is made of, for example, $Mg_3N_2$ and has a needle-like structure. The magnesium nitride phase 35 is partially formed in a region of the Mg solid solution layer 32 on the magnesium oxide layer 31 side.

In the present embodiment, it is preferable that the area ratio of an intermetallic compound phase in a region from the bonding surface of the ceramic substrate 11 to 50 μm toward the copper sheet 22 (circuit layer 12) and the copper sheet 23 (metal layer 13) side be 15% or less.

As described above, when the area ratio of the intermetallic compound phase at the bonded interface is suppressed, a Cu—Mg intermetallic compound phase containing Cu and Mg may be dispersed inside the Mg solid solution layer 32. Examples of the Cu—Mg intermetallic compound phase include $Cu_2Mg$ and $CuMg_2$.

Figure 3:
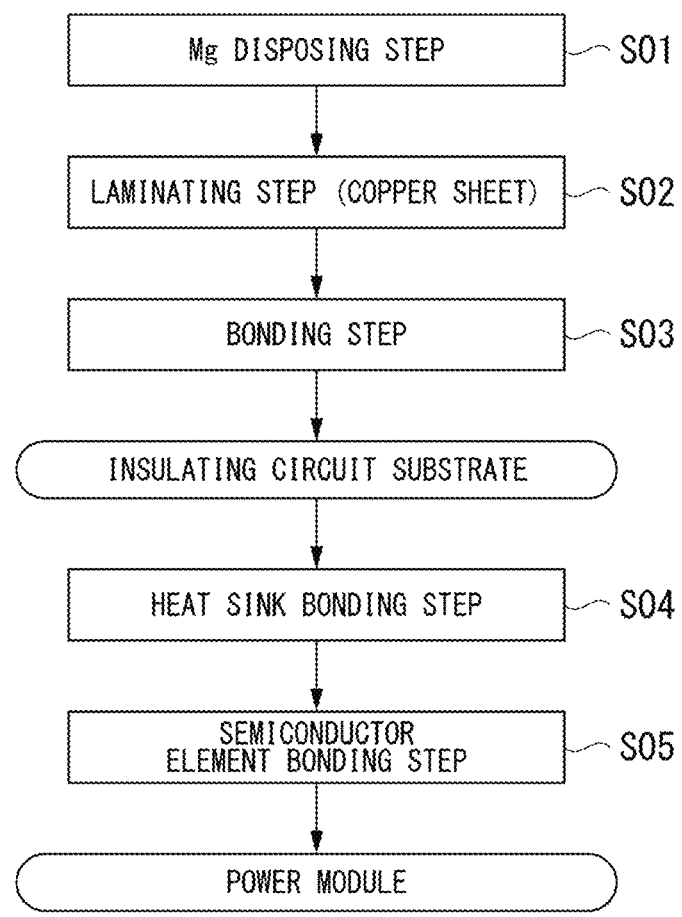
FIG. 3 is a flowchart showing a production method of the insulating circuit substrate (copper/ceramic bonded body) according to the embodiment of the present invention.

Next, a production method of the insulating circuit substrate 10 according to the present embodiment described above will be described with reference to FIGS. 3 and 4.

(Mg-Disposing Step S01)

As illustrated in FIG. 4, Mg is disposed between the copper sheet 22 which is to become the circuit layer 12 and the ceramic substrate 11 and between the copper sheet 23 which is to become the metal layer 13 and the ceramic substrate 11. In the present embodiment, the Mg film 25 is formed on the copper sheets 22 and 23 by vapor deposition of Mg.

In the Mg-disposing step S01, the amount of Mg to be disposed is in a range of 0.17 $mg/cm^2$ or more and 3.48 $mg/cm^2$ or less.

(Laminating Step S02)

Next, the copper sheet 22 and the ceramic substrate 11 are laminated with the Mg film 25 interposed therebetween, and the ceramic substrate 11 and the copper sheet 23 are laminated with the Mg film 25 interposed therebetween.

(Bonding Step S03)

Next, the copper sheet 22, the ceramic substrate 11, and the copper sheet 23 which are laminated are pressed in a laminating direction and are loaded into a vacuum furnace and heated such that the copper sheet 22, the ceramic substrate 11, and the copper sheet 23 are bonded together.

The pressing load in the bonding step S03 is preferably in a range of 0.049 MPa or more and 3.4 MPa or less.

The heating temperature in the bonding step S03 is preferably in a range of 500° C. or higher and 850° C. or lower.

The degree of vacuum in the bonding step S03 is preferably in a range of $1\times10^{-6}$ Pa or more and $5\times10^{-2}$ Pa or less.

The retention time at the heating temperature is preferably in a range of 5 minutes or longer and 180 minutes or shorter.

The temperature-lowering rate when the temperature is lowered from the heating temperature (bonding temperature) to 480° C. is not particularly limited, but is preferably 20° C./min or less, and more preferably 10° C./min or less. In addition, the lower limit of the temperature-lowering rate is not particularly limited, but may be 2° C./min or more, 3° C./min or more, or 5° C./min or more.

As described above, the insulating circuit substrate 10 according to the present embodiment is produced by the Mg-disposing step S01, the laminating step S02, and the bonding step S03.

(Heat Sink-Bonding Step S04)

Next, the heat sink 51 is bonded to the other surface side of the metal layer 13 of the insulating circuit substrate 10. The insulating circuit substrate 10 and the heat sink 51 are laminated with the solder material interposed therebetween and are loaded into a heating furnace such that the insulating circuit substrate 10 and the heat sink 51 are soldered to each other with the second solder layer 8 interposed therebetween.

(Semiconductor Element-Bonding Step S05)

Next, the semiconductor element 3 is bonded to one surface of the circuit layer 12 of the insulating circuit substrate 10 by soldering.

The power module 1 illustrated in FIG. 1 is produced by the above steps.

According to the insulating circuit substrate 10 (copper/ceramic bonded body) of the present embodiment configured as described above, the copper sheet 22 (circuit layer 12) and the copper sheet 23 (metal layer 13) made of oxygen-free copper and the ceramic substrate 11 made of a silicon nitride are bonded to each other with the Mg film 25 interposed therebetween, the magnesium oxide layer 31 is formed on the ceramic substrate 11 side between the ceramic substrate 11 and the circuit layer 12 (copper sheet 22) and between the ceramic substrate 11 and the metal layer 13 (copper sheet 22), the Mg solid solution layer 32 in which Mg is in a state of a solid solution in the Cu primary phase is laminated, and the magnesium nitride phase 35 is present on the magnesium oxide layer 31 side of the Mg solid solution layer 32. The magnesium nitride phase 35 is formed by the reaction of Mg with nitrogen in the ceramic substrate 11, and thus the ceramic substrate 11 sufficiently reacts.

Therefore, an interfacial reaction proceeds sufficiently at the bonded interfaces between the copper sheet 22 (circuit layer 12) and the copper sheet 23 (metal layer 13) and the ceramic substrate 11, so that the insulating circuit substrate 10 (copper/ceramic bonded body) in which the copper sheet 22 (circuit layer 12) and the copper sheet 23 (metal layer 13) and the ceramic substrate 11 are reliably bonded can be obtained.

Since Ti, Zr, Nb, and Hf are not present at the bonded interfaces between the copper sheet 22 (circuit layer 12) and the copper sheet 23 (metal layer 13) and the ceramic substrate 11, a nitride phase of Ti, Zr, Nb, and Hf and an intermetallic compound phase containing Ti, Zr, Nb, and Hf are not generated, and breaking of the ceramic substrate 11 can be suppressed even during high-temperature operation. The total amount of Ti, Zr, Nb, and Hf at the bonded interfaces between the copper sheet 22 (circuit layer 12) and the copper sheet 23 (metal layer 13) and the ceramic substrate 11 is preferably 0.3 mass % or less, and preferably 0.1 mass % or less.

Since Ag is not present at the bonded interfaces between the ceramic substrate 11 and the copper sheet 22 (circuit layer 12) and the copper sheet 23 (metal layer 13), excellent migration resistance is achieved. The amount of Ag at the bonded interfaces between the copper sheet 22 (circuit layer 12) and the copper sheet 23 (metal layer 13) and the ceramic substrate 11 is preferably 0.2 mass % or less, and more preferably 0.1 mass % or less.

In the present embodiment, in a case where the area ratio of the intermetallic compound phase in the region from the bonding surface of the ceramic substrate 11 to 50 μm toward the copper sheet 22 (circuit layer 12) and the copper sheet 23 (metal layer 13) side is 15% or less, there are not a large number of hard and brittle intermetallic compound phases in the vicinity of the bonding surface of the ceramic substrate 11, and it becomes possible to reliably suppress breaking of the ceramic substrate 11 during high-temperature operation.

The area ratio of the intermetallic compound phase in the region from the bonding surface of the ceramic substrate 11 to 50 μm toward the copper sheet 22 (circuit layer 12) and the copper sheet 23 (metal layer 13) side is preferably 10% or less, and more preferably 8% or less.

According to the production method of the insulating circuit substrate 10 (copper/ceramic bonded body) of the present embodiment, since the Mg-disposing step S01 of disposing Mg (the Mg film 25) between the copper sheets 22 and 23 and the ceramic substrate 11, the laminating step S02 of laminating the copper sheets 22 and 23 and the ceramic substrate 11 with the Mg film 25 interposed therebetween, and the bonding step S03 of performing the heating treatment on the copper sheet 22, the ceramic substrate 11, and the copper sheet 23 which are laminated in a state of being pressed in the laminating direction under a vacuum atmosphere to bond the copper sheet 22, the ceramic substrate 11, and the copper sheet 23 together are provided, no gas or no residue of organic matter remains at the bonded interface.

In the Mg-disposing step S01, since the amount of Mg is in a range of 0.17 mg/cm$^2$ or more and 3.48 mg/cm$^2$ or less, a liquid phase necessary for the interfacial reaction can be sufficiently obtained. Therefore, the insulating circuit substrate 10 (copper/ceramic bonded body) in which the copper sheets 22 and 23 and the ceramic substrate 11 are reliably bonded can be obtained.

Since Ti, Zr, Nb, and Hf are not used for bonding, a nitride phase of Ti, Zr, Nb, and Hf and an intermetallic compound phase containing Ti, Zr, Nb, and Hf are not present in the vicinity of the bonding surface of the ceramic substrate 11, and the insulating circuit substrate 10 (copper/ceramic bonded body) capable of suppressing breaking of the ceramic substrate 11 during high-temperature operation can be obtained.

Since Ag is not used for bonding, the insulating circuit substrate 10 (copper/ceramic bonded body) excellent in migration resistance can be obtained.

In a case where the amount of Mg is less than 0.17 mg/cm$^2$, the amount of the generated liquid phase is insufficient, and there is concern that the bonding rate may decrease. In a case where the amount of Mg exceeds 3.48 mg/cm$^2$, the amount of the generated liquid phase becomes excessive, the liquid phase may leak from the bonded interface, and there is concern that a bonded body having a predetermined shape may not be produced. Furthermore, the amount of the generated liquid phase becomes excessive, the Cu—Mg intermetallic compound phase may be excessively generated, and there is concern that breaking may occur in the ceramic substrate 11.

From the above description, in the present embodiment, the amount of Mg is in a range of 0.17 mg/cm$^2$ or more and 3.48 mg/cm$^2$ or less.

The lower limit of the amount of Mg is preferably 0.24 mg/cm$^2$ or more, and more preferably 0.32 mg/cm$^2$ or more.

On the other hand, the upper limit of the amount of Mg is preferably 2.38 mg/cm$^2$ or less, and more preferably 1.58 mg/cm$^2$ or less.

In the present embodiment, since the pressing load in the bonding step S03 is 0.049 MPa or more, the ceramic substrate 11, the copper sheets 22 and 23, and the Mg film 25 can be brought into close contact, so that the interfacial reactions therebetween during heating can be promoted. Since the pressing load in the bonding step S03 is 3.4 MPa or less, breaking and the like in the ceramic substrate 11 in the bonding step S03 can be suppressed.

The lower limit of the pressing load in the bonding step S03 is preferably 0.098 MPa or more, and more preferably 0.294 MPa or more. On the other hand, the upper limit of the pressing load in the bonding step S03 is preferably 1.96 MPa or less, and more preferably 0.98 MPa or less.

In the present embodiment, since the heating temperature in the bonding step S03 is equal to or higher than 500° C., which is higher than the eutectic temperature of Cu and Mg, a liquid phase can be sufficiently generated at the bonded interface. On the other hand, since the heating temperature in the bonding step S03 is 850° C. or lower, the excessive generation of the liquid phase can be suppressed. Furthermore, the thermal load on the ceramic substrate 11 is reduced, so that the deterioration of the ceramic substrate 11 can be suppressed.

The lower limit of the heating temperature in the bonding step S03 is preferably 600° C. or higher, and more preferably 680° C. or higher. On the other hand, the upper limit of the heating temperature in the bonding step S03 is preferably 800° C. or lower, and more preferably 760° C. or lower.

In the present embodiment, in a case where the degree of vacuum in the bonding step S03 is in a range of $1\times10^{-6}$ Pa or more and $5\times10^{-2}$ Pa or less, the oxidation of the Mg film 25 can be suppressed, and it becomes possible to reliably bond the ceramic substrate 11 and the copper sheets 22 and 23.

The lower limit of the degree of vacuum in the bonding step S03 is preferably $1\times10^{-4}$ Pa or more, and more preferably $1\times10^{-3}$ Pa or more. On the other hand, the upper limit of the degree of vacuum in the bonding step S03 is preferably $1\times10^{-2}$ Pa or less, and more preferably $5\times10^{-3}$ Pa or less.

In the present embodiment, in a case where the retention time at the heating temperature in the bonding step S03 is in a range of 5 minutes or longer and 180 minutes or shorter, a liquid phase can be sufficiently formed, and it becomes possible to reliably bond the ceramic substrate 11 and the copper sheets 22 and 23.

The lower limit of the retention time at the heating temperature in the bonding step S03 is preferably 10 minutes or longer, and more preferably 30 minutes or longer. On the other hand, the upper limit of the retention time at the heating temperature in the bonding step S03 is preferably 150 minutes or shorter, and more preferably 120 minutes or shorter.

While the embodiments of the present invention have been described above, the present invention is not limited thereto and can be modified as appropriate without departing from the technical spirit of the invention.

For example, although the copper sheet which constitutes the circuit layer or the metal layer is described as the rolled sheet of oxygen-free copper, the copper sheet is not limited thereto, and may also be made of another kind of copper or copper alloy.

In the present embodiment, although the circuit layer and the metal layer are described as being constituted by the copper sheets, the circuit layer and the metal layer are not limited thereto. As long as at least one of the circuit layer and the metal layer is constituted by a copper sheet, the other may be constituted by another metal sheet such as an aluminum sheet.

In the present embodiment, although it is described in the Mg-disposing step that the Mg film is formed by vapor deposition, the Mg film is not limited thereto, and the Mg film may be formed by another method, or a Mg foil may be disposed. Alternatively, a clad material of Cu and Mg may be disposed.

A Mg paste and a Cu—Mg paste may be applied. In addition, a Cu paste and a Mg paste may be laminated and disposed. At this time, the Mg paste may be disposed on either the copper sheet side or the ceramic substrate side. In addition, MgH$_2$ may be disposed as Mg.

Although the heat sink is exemplified by the heat-dissipating sheet, the heat sink is not limited thereto, and there is no particular limitation on the structure of the heat sink. For example, one having a passage through which a refrigerant flows or one having a cooling fin may be used. In addition, as the heat sink, a composite material (for example, AlSiC) containing aluminum or an aluminum alloy can also be used.

Furthermore, a buffer layer made of aluminum or an aluminum alloy or a composite material containing aluminum (for example, AlSiC) may be provided between the top sheet part or heat-dissipating sheet of the heat sink and the metal layer.

In the present embodiment, configuring the power module by mounting the power semiconductor element on the circuit layer of the insulating circuit substrate has been described, but the present embodiment is not limited thereto. For example, an LED module may be configured by mounting an LED element on the insulating circuit substrate, or a thermoelectric module may be configured by mounting a thermoelectric element on the circuit layer of the insulating circuit substrate.

EXAMPLES

Examples 1 to 12

A confirmatory experiment performed to confirm the effectiveness of the present invention will be described.

A copper/ceramic bonded body was formed by laminating copper sheets (oxygen-free copper, 37 mm square, thickness 1.2 mm) in which Mg was disposed as shown in Table 1, on both surfaces of a 40 mm square ceramic substrate made of a silicon nitride and bonding the laminated sheets under bonding conditions shown in Table 1. The thickness of the ceramic substrate was 0.32 mm. In addition, the degree of vacuum of the vacuum furnace at the time of bonding was $5\times10^{-3}$ Pa.

In a related art example, an active brazing material of Ag-28 mass % Cu-6 mass % Ti was disposed between the ceramic substrate and the copper sheet so that the amount of Ag was 5.2 mg/cm$^2$.

In addition, when the temperature in the bonding step S03 was lowered from the bonding temperature ("Temperature (° C.)" in Table 1) to 480° C., the temperature-lowering rate was controlled to be a rate of 5° C./min. The temperature-lowering rate is controlled by the partial pressure of a gas during gas cooling (whether or not circulation is performed by a cooling fan).

Regarding the copper/ceramic bonded bodies obtained as described above, the bonded interface was observed, and a Mg solid solution layer, a Cu—Mg intermetallic compound phase, a magnesium nitride phase were checked. In addition, the initial bonding rate of the copper/ceramic bonded body, breaking of the ceramic substrate after thermal cycles, and migration properties were evaluated as follows.

(Mg Solid Solution Layer)

Regarding the bonded interface between the copper sheet and the ceramic substrate, a region (400 μm×600 μm) including the bonded interface was observed under the conditions of a magnification of 2,000 times and an accelerating voltage of 15 kV using an EPMA apparatus (JXA-8539F manufactured by JEOL Ltd.), quantitative analysis was performed on a range of 10 points or more and 20 points or less depending on the thickness of the copper sheet at intervals of 10 μm from the surface of the ceramic substrate toward the copper sheet side, and a region having a Mg concentration of 0.01 at % or more was regarded as a Mg solid solution layer.

(Area Ratio of Cu—Mg Intermetallic Compound Phase)

Regarding the bonded interface between the copper sheet and the ceramic substrate, an element map of Mg of the region (400 μm×600 μm) including the bonded interface was acquired under the conditions of a magnification of 2,000 times and an accelerating voltage of 15 kV using an electron micro analyzer (JXA-8539F manufactured by JEOL Ltd.), and a region satisfying that the Cu concentration as a five-point average of quantitative analysis in the region where the presence of Mg was confirmed was 5 at % or more and the Mg concentration was 30 at % or more and 70 at % or less was regarded as a Cu—Mg intermetallic compound phase.

Then, the area ratio (%) of the intermetallic compound phase in the region from the bonding surface of the ceramic substrate to 50 μm toward the copper sheet side was calculated.

(Magnesium Nitride Phase)

The bonded interface between the copper sheet and the ceramic substrate was observed using a transmission electron microscope (Titan ChemiSTEM manufactured by FEI Company) at an accelerating voltage of 200 kV and a magnification of 40,000 times, and a case where a region where Mg and N coexisted was present and the Mg concentration in the region was 50 at % or more and 70 at % or less was evaluated as a magnesium nitride layer "present".

(Initial Bonding Rate)

The bonding rate between the copper sheet and the ceramic substrate was obtained using the following equation using an ultrasonic flaw detector (FineSAT200 manufactured by Hitachi Power Solutions Co., Ltd.). The initial bonding area was the area to be bonded before bonding, that is, the area of the bonding surface of the copper sheet. In the ultrasonic-detected image, peeling was indicated by a white portion in the bonding part, and thus the area of the white portion was regarded as a peeled area.

(Initial bonding rate)={(initial bonding area)−(peeled area)}/(initial bonding area)

(Breaking in Ceramic Substrate)

Using a thermal shock tester (TSA-72ES manufactured by ESPEC Corp.), 1000 cycles, where one cycle is 10 minutes at −50° C. and 10 minutes at 150° C., were performed in a gas phase.

The presence or absence of breaking in the ceramic substrate after applying the above-mentioned thermal cycles was evaluated.

(Migration)

The electric resistance between circuit patterns was measured after being left for 2,000 hours under the conditions of a distance between the circuit patterns separated by insulation in a circuit layer of 0.5 mm, a temperature of 85° C., a humidity of 85% RH, and a voltage of DC50V. A case where the resistance value was $1 \times 10^6 \Omega$ or less was determined as a short-circuit (migration had occurred), and the migration was evaluated as "B". After being left for 2,000 hours under the same conditions as above, the electric resistance between the circuit patterns was measured. A case where the resistance value was greater than $1 \times 10^6 \Omega$ was determined as the absence of migration, and the migration was evaluated as "A".

Figure 5:
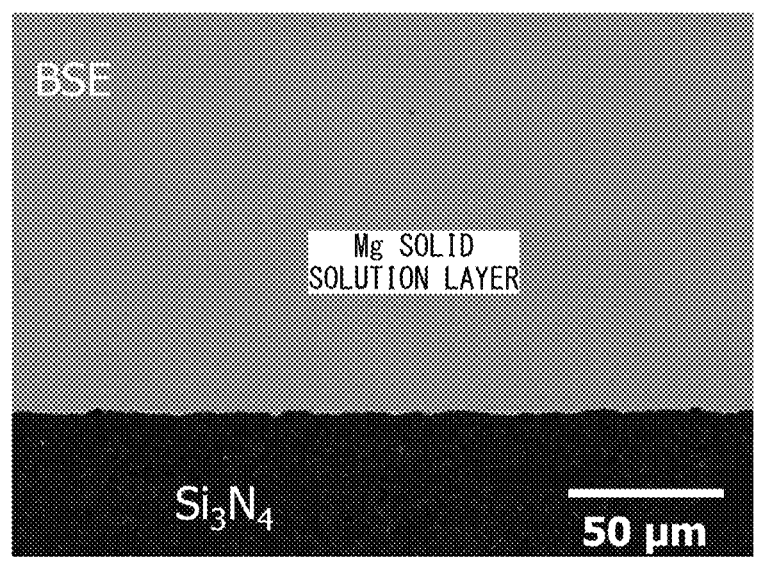
FIG. 5 is an observation result of a bonded interface between a copper sheet and a ceramic substrate in a copper/ceramic bonded body of Example 5.

The evaluation results are shown in Table 2. In addition, the observation results of Example 5 are shown in FIG. 5.

TABLE 1

| | Mg-disposing step | Bonding step | | |
|---|---|---|---|---|
| | Amount of Mg mg/cm² | Load MPa | Temperature ° C. | Time min |
| Example 1 | 1.58 | 0.98 | 600 | 150 |
| Example 2 | 0.32 | 1.96 | 760 | 90 |
| Example 3 | 0.29 | 1.96 | 720 | 5 |
| Example 4 | 0.17 | 0.049 | 500 | 10 |
| Example 5 | 0.24 | 3.4 | 850 | 180 |
| Example 6 | 2.53 | 0.98 | 830 | 150 |
| Example 7 | 0.79 | 1.96 | 800 | 90 |
| Example 8 | 1.27 | 0.294 | 740 | 60 |
| Example 9 | 3.48 | 0.294 | 850 | 180 |
| Example 10 | 2.38 | 1.96 | 680 | 30 |
| Example 11 | 1.43 | 1.96 | 650 | 120 |
| Example 12 | 2.22 | 0.049 | 820 | 90 |
| Comparative Example 1 | 0.11 | 3.4 | 850 | 180 |
| Comparative Example 2 | 6.34 | 0.049 | 740 | 90 |
| Related Art Example | (Active brazing material) | 0.049 | 820 | 90 |

TABLE 2

| | Observation result of bonded interface | | | | | |
|---|---|---|---|---|---|---|
| | Magnesium nitride phase | Mg solid solution layer | Area ratio of Cu—Mg intermetallic compound phase (%) | Initial bonding rate % | Presence or absence of ceramic breaking | Migration |
| Example 1 | Present | Present | 10.6 | 98.3 | Absent | A |
| Example 2 | Present | Present | 0.9 | 94.7 | Absent | A |
| Example 3 | Present | Present | 3.2 | 93.5 | Absent | A |
| Example 4 | Present | Present | 4.2 | 91.3 | Absent | A |
| Example 5 | Present | Present | 0.0 | 97.2 | Absent | A |
| Example 6 | Present | Present | 5.8 | 99.4 | Absent | A |
| Example 7 | Present | Present | 2.4 | 96.1 | Absent | A |

TABLE 2-continued

| | Magnesium nitride phase | Mg solid solution layer | Area ratio of Cu—Mg intermetallic compound phase (%) | Initial bonding rate % | Presence or absence of ceramic breaking | Migration |
|---|---|---|---|---|---|---|
| | | | Observation result of bonded interface | | | |
| Example 8 | Present | Present | 4.7 | 99.0 | Absent | A |
| Example 9 | Present | Present | 6.1 | 98.4 | Absent | A |
| Example 10 | Present | Present | 9.5 | 97.1 | Absent | A |
| Example 11 | Present | Present | 8.8 | 98.2 | Absent | A |
| Example 12 | Present | Present | 5.8 | 96.9 | Absent | A |
| Comparative Example 1 | Bonded body was not formed, and evaluation was stopped | | | | | |
| Comparative Example 2 | Bonded body was not formed, and evaluation was stopped | | | | | |
| Related Art Example | — | — | — | 98.0 | Present | B |

In Comparative Example 1 in which the amount of Mg was 0.11 mg/cm$^2$ in the Mg-disposing step, which was smaller than the range of the present invention, since the liquid phase was insufficient at the time of bonding, a bonded body could not be formed. Therefore, the subsequent evaluation was stopped.

In Comparative Example 2 in which the amount of Mg was 6.34 mg/cm$^2$ in the Mg-disposing step, which was greater than the range of the present invention, since the liquid phase was excessively generated at the time of bonding, the liquid phase leaked from the bonded interface and a bonded body having a predetermined shape could not be produced. Therefore, the subsequent evaluation was stopped.

In the related art example in which a ceramic substrate and a copper sheet were bonded to each other using a Ag—Cu—Ti brazing material, evaluation of migration was determined as "B". It is presumed that this is because Ag was present at the bonded interface.

Contrary to this, in Examples 1 to 12, the initial bonding rate was high, and no breaking was confirmed in the ceramic substrate. Also, migration was good.

Furthermore, as shown in FIG. 5, as a result of observing the bonded interface, the Mg solid solution layer was observed. In addition, a magnesium oxide layer was observed, and a magnesium nitride phase was confirmed on the magnesium oxide layer side of the Mg solid solution layer.

Examples 21 to 32

Copper/ceramic bonded bodies were produced in the same manner as the copper/ceramic bonded bodies produced in Examples 1 to 12, and regarding the obtained copper/ceramic bonded bodies, the area ratio of Cu$_2$Mg and an ultrasonic bonded interface were evaluated as follows.

The evaluations of the area ratios of the Mg solid solution layer and the Cu—Mg intermetallic compound phase, and the initial bonding rate of the copper/ceramic bonded body were performed in the same manner as in the evaluations performed in Examples 1 to 12.

(Temperature-Lowering Rate)

In the bonding step S03, when the temperature was lowered from the bonding temperature ("Temperature (° C.)" in Table 3) to 480° C., the temperature-lowering rate was controlled to be the rate shown in Table 3.

(Area Ratio of Cu$_2$Mg)

In the Cu—Mg intermetallic compound phase, the area ratio (%) of Cu$_2$Mg was defined and calculated by the following calculation formula.

Area ratio (%) of Cu$_2$Mg=area of Cu$_2$Mg/(area of Cu$_2$Mg+area of CuMg$_2$)×100

"Area of Cu$_2$Mg" was a region in which the Mg concentration was 30 at % or more and less than 60 at %, and "area of CuMg$_2$" was a region in which the Mg concentration was 60 at % or more and less than 70 at %.

(Ultrasonic Bonding)

Regarding the obtained copper/ceramic bonded bodies, using an ultrasonic metal bonder (60C-904 manufactured by Ultrasonic Engineering Co., Ltd.), a copper terminal (10 mm×5 mm×1.5 mm thick) was ultrasonically bonded under the condition of a collapse amount of 0.5 mm.

After bonding, the bonded interface between the copper sheet and the ceramic substrate was inspected using the ultrasonic flaw detector (FineSAT200 manufactured by Hitachi Power Solutions Co., Ltd.). Those in which peeling was observed were evaluated as "B", and those in which neither was confirmed were evaluated as "A". The evaluation results are shown in Table 3.

TABLE 3

| | Mg-disposing step Amount of Mg (mg/cm$^2$) | Bonding step | | | | Magnesium nitride phase | Mg solid solution layer | Observation result of bonded interface | | | |
|---|---|---|---|---|---|---|---|---|---|---|---|
| | | Load (MPa) | Temperature (° C.) | Time (min) | Temperature-lowering rate (° C./min) | | | Area ratio of Cu—Mg intermetallic compound phase (%) | Area ratio of Cu$_2$Mg (%) | Initial bonding rate (%) | Ultrasonic bonding |
| Example 21 | 1.58 | 0.98 | 600 | 150 | 5 | Present | Present | 11.4 | 92.4 | 98.3 | A |
| Example 22 | 1.58 | 0.98 | 600 | 150 | 8 | Present | Present | 10.6 | 93.5 | 97.3 | A |
| Example 23 | 1.58 | 0.98 | 600 | 150 | 16 | Present | Present | 11.1 | 74.7 | 98.6 | A |
| Example 24 | 1.58 | 0.98 | 600 | 150 | 24 | Present | Present | 10.3 | 63.4 | 99.0 | B |

TABLE 3-continued

| | Mg-disposing step Amount of Mg (mg/cm$^2$) | Bonding step | | | | Observation result of bonded interface | | | | |
| | | Load (MPa) | Temperature (° C.) | Time (min) | Temperature-lowering rate (° C./min) | Magnesium nitride phase | Mg solid solution layer | Area ratio of Cu—Mg intermetallic compound phase (%) | Area ratio of Cu$_2$Mg (%) | Initial bonding rate (%) | Ultrasonic bonding |
|---|---|---|---|---|---|---|---|---|---|---|---|
| Example 25 | 2.38 | 1.96 | 680 | 30 | 2 | Present | Present | 10.5 | 99.4 | 98.8 | A |
| Example 26 | 2.38 | 1.96 | 680 | 30 | 5 | Present | Present | 9.5 | 96.2 | 97.1 | A |
| Example 27 | 2.38 | 1.96 | 680 | 30 | 10 | Present | Present | 8.7 | 86.7 | 97.0 | A |
| Example 28 | 2.38 | 1.96 | 680 | 30 | 30 | Present | Present | 10.1 | 53.1 | 97.2 | B |
| Example 29 | 1.43 | 1.96 | 650 | 120 | 3 | Present | Present | 8.8 | 97.9 | 98.1 | A |
| Example 30 | 1.43 | 1.96 | 650 | 120 | 5 | Present | Present | 8.8 | 99.0 | 98.2 | A |
| Example 31 | 1.43 | 1.96 | 650 | 120 | 20 | Present | Present | 9.3 | 70.2 | 97.5 | A |
| Example 32 | 1.43 | 1.96 | 650 | 120 | 30 | Present | Present | 8.9 | 56.3 | 98.6 | B |

The value of the area ratio of Cu$_2$Mg and the bonding properties of ultrasonic bonding changed depending on the temperature-lowering rate after the bonding step S03.

From the results shown in Table 3, it became clear that the temperature-lowering rate is preferably 20° C./min, and more preferably 10° C./min.

From the results shown in Table 3, it became clear that in the Cu—Mg intermetallic compound phase, the area ratio of Cu$_2$Mg is preferably 70% or more, more preferably 85% or more, and even more preferably 90% or more.

From the above description, according to the Examples, it was confirmed that it is possible to provide a copper/ceramic bonded body (insulating circuit substrate) in which a copper member and a ceramic member are reliably bonded to each other, excellent migration resistance is achieved, and the occurrence of ceramic breaking during high-temperature operation can be suppressed.

In addition, according to the Examples, it was confirmed that it is possible to provide a copper/ceramic bonded body (insulating circuit substrate) in which a copper member and a ceramic member are reliably bonded to each other by controlling a temperature-lowering rate from a bonding temperature to 480° C., and excellent ultrasonic bonding properties were achieved.

INDUSTRIAL APPLICABILITY

According to the present invention, it becomes possible to provide a copper/ceramic bonded body in which a copper member and a ceramic member are reliably bonded to each other, excellent migration resistance is achieved, and the occurrence of ceramic breaking during high-temperature operation can be suppressed, an insulating circuit substrate, a production method of the copper/ceramic bonded body, and a production method of the insulating circuit substrate.

REFERENCE SIGNS LIST

10 Insulating circuit substrate
11 Ceramic substrate
12 Circuit layer
13 Metal layer
22, 23 Copper sheet
31 Magnesium oxide layer
32 Mg solid solution layer
35 Magnesium nitride phase

What is claimed is:

1. A copper/ceramic bonded body, comprising:
a copper member made of copper or a copper alloy; and
a ceramic member made of a silicon nitride,
wherein, the copper member and the ceramic member are bonded to each other;
a magnesium oxide layer is provided on a ceramic member side of a bonded interface between the copper member and the ceramic member,
a Mg solid solution layer is provided between the magnesium oxide layer and the copper member and contains Mg in a state of a solid solution in a Cu primary phase, and
a magnesium nitride phase is present on a magnesium oxide layer side of the Mg solid solution layer.

2. The copper/ceramic bonded body according to claim 1, wherein, in a region from a bonding surface of the ceramic member to 50 μm toward a copper member side, an area ratio of an intermetallic compound phase is 15% or less.

3. An insulating circuit substrate, comprising:
a copper sheet made of copper or a copper alloy; and
a ceramic substrate made of a silicon nitride,
wherein, the copper sheet is bonded to a surface of the ceramic substrate,
a magnesium oxide layer is provided on a ceramic substrate side of a bonded interface between the copper sheet and the ceramic substrate,
a Mg solid solution layer is provided between the magnesium oxide layer and the copper sheet and contains Mg in a state of a solid solution in a Cu primary phase, and
a magnesium nitride phase is present on a magnesium oxide layer side of the Mg solid solution layer.

4. The insulating circuit substrate according to claim 3, wherein, in a region from a bonding surface of the ceramic substrate to 50 μm toward a copper sheet side, an area ratio of an intermetallic compound phase is 15% or less.

5. A production method of a copper/ceramic bonded body, for producing the copper/ceramic bonded body according to claim 1, the production method comprising:
a Mg-disposing step of disposing Mg between the copper member and the ceramic member;
a laminating step of laminating the copper member and the ceramic member with Mg interposed therebetween; and a bonding step of performing a heating treatment on the copper member and the ceramic member laminated with Mg interposed therebetween in a state of being pressed in a laminating direction under a vacuum atmosphere to bond the copper member and the ceramic member to each other, wherein, in the Mg-disposing step, an amount of Mg is in a range of 0.17 mg/cm$^2$ or more and 3.48 mg/cm$^2$ or less.

6. The production method of a copper/ceramic bonded body according to claim 5, wherein, in the bonding step, a pressing load is in a range of 0.049 MPa or more and 3.4 MPa or less, and a heating temperature is in a range of 500° C. or higher and 850° C. or lower.

7. A production method of the insulating circuit substrate according to claim 3, the production method comprising:

a Mg-disposing step of disposing Mg between the copper sheet and the ceramic substrate;

a laminating step of laminating the copper sheet and the ceramic substrate with Mg interposed therebetween; and a bonding step of performing a heating treatment on the copper sheet and the ceramic substrate laminated with Mg interposed therebetween in a state of being pressed in a laminating direction under a vacuum atmosphere to bond the copper sheet and the ceramic substrate to each other, wherein, in the Mg-disposing step, an amount of Mg is in a range of 0.17 mg/cm$^2$ or more and 3.48 mg/cm$^2$ or less.

8. The production method of the insulating circuit substrate according to claim 7, wherein, in the bonding step, a pressing load is in a range of 0.049 MPa or more and 3.4 MPa or less, and a heating temperature is in a range of 500° C. or higher and 850° C. or lower.

* * * * *